United States Patent [19]
Capodieci

[11] Patent Number: 6,013,396
[45] Date of Patent: Jan. 11, 2000

[54] FABRICATION OF CHROME/PHASE GRATING PHASE SHIFT MASK BY INTERFEROMETRIC LITHOGRAPHY

[75] Inventor: Luigi Capodieci, Sunnyvale, Calif.

[73] Assignee: Advanced Micro Devices, Inc., Sunnyvale, Calif.

[21] Appl. No.: 09/183,522

[22] Filed: Oct. 30, 1998

[51] Int. Cl.[7] .................................................... G03F 9/00
[52] U.S. Cl. .............................................................. 430/5
[58] Field of Search ............................... 430/5, 322, 396; 378/35

[56] References Cited

U.S. PATENT DOCUMENTS

| | | | |
|---|---|---|---|
| 5,413,884 | 5/1995 | Koch et al. ................................. | 430/5 |
| 5,415,835 | 5/1995 | Brueck et al. . | |
| 5,601,954 | 2/1997 | Krivokapic et al. . | |

OTHER PUBLICATIONS

"Lithography II: Optical Aligners and Photomasks", *Silicon Processing for the VLSI Era*, pp. 459–489.

"Improving Resolution in Photolithography with a Phase-Shifting Mask", *IEEE Transactions on Electron Devices*, vol. ED-29, No. 12, Dec., 1982, pp. 1828–1836.

"Lithography Process Control: Tolerance Limits of Deep Ultraviolet Photolithography, Electron Beam Lithography, and Scanning Probe Lithography", by Kathryn Wilder, Bhanwar Singh and David F. Kyser, *The 42$^{nd}$ International Conference on Electron, Ion and Photon Beam Technology and Nanofabrication*, Sponsored by: The American Vacuum Society in cooperative with: The Electron Devices Society of the Institute of Electrical and Electronic Engineers and The Optical Society of America, The Westin Hotel, Chicago, IL., May 26–29, 1998, 3 pages.

"Pattern–Dependent Correction of Mask Topography Effects for Alternating Phase–Shifting Masks", SPIE, vol. 2440, by Richard A. Ferguson, Alfred K. Wong, Timothy A. Brunner and Lars W. Liebmann, pp. 349–360.

*Primary Examiner*—S. Rosasco
*Attorney, Agent, or Firm*—Amin, Eschweiler & Turocy, LLP

[57] ABSTRACT

A mask (50) for use in lithographic printing includes a pattern (54) formed of a material which is substantially opaque with respect to a wavelength of radiation being used in the lithographic printing. The pattern (54) on the mask (50) corresponds to a desired feature to be formed on a substrate and includes a grating (58) having an alternating pattern of opaque and transparent regions (60, 62). The alternating pattern provides destructive interference of radiation at the substrate in a region corresponding to the desired feature due to diffraction, thereby improving resolution at the substrate. In addition, the alternating pattern (60, 62) on the mask (50) increases a number of focal planes at which the destructive interference occurs and thereby improves a focus process latitude by providing an acceptable resolution over variations in a distance between the mask (50) and the substrate.

10 Claims, 7 Drawing Sheets

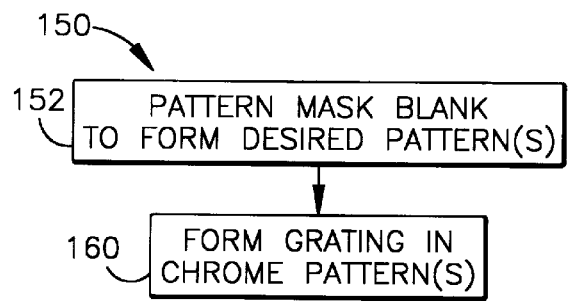
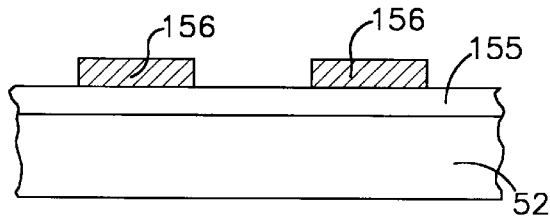
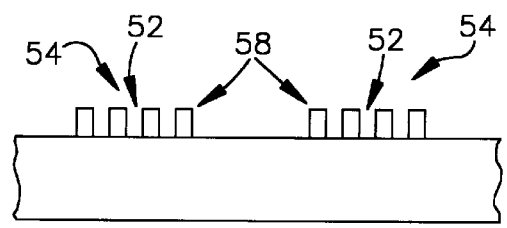
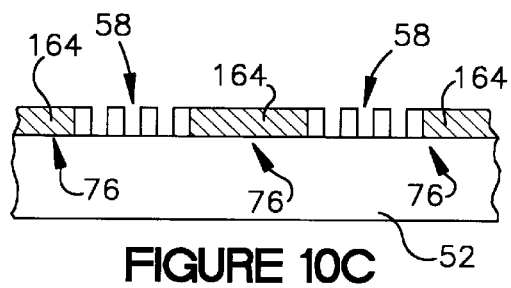
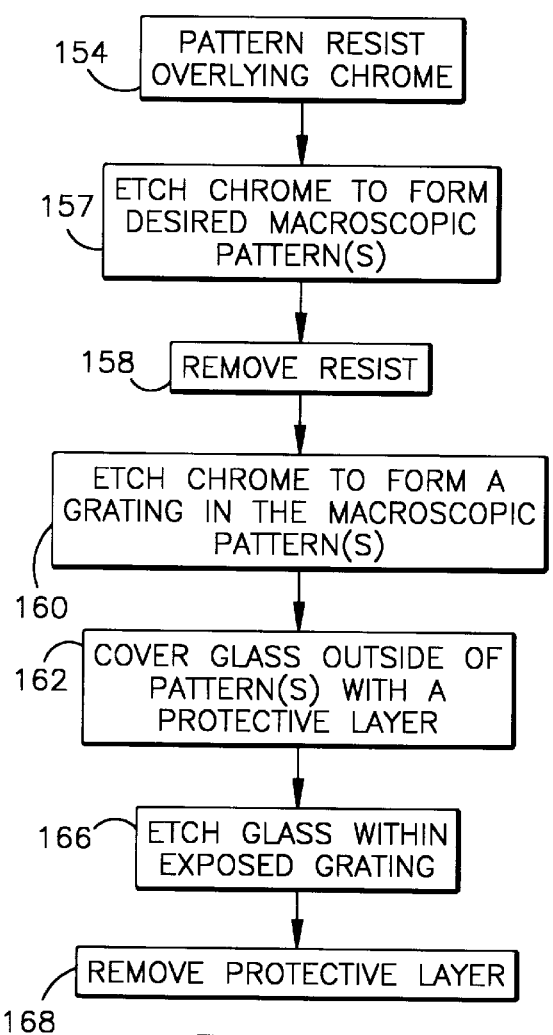
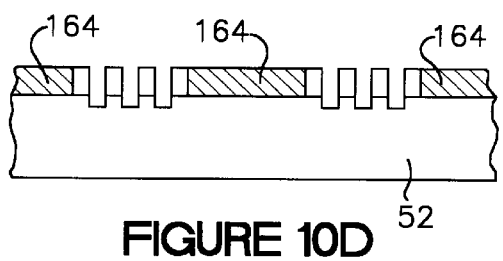
FIGURE 8
FIGURE 10A
FIGURE 10B
FIGURE 10C
FIGURE 9
FIGURE 10D

FABRICATION OF CHROME/PHASE GRATING PHASE SHIFT MASK BY INTERFEROMETRIC LITHOGRAPHY

FIELD OF THE INVENTION

The present invention generally relates to lithography tools and methods for making such tools, and more particularly relates to a phase shift mask design providing improved resolution and focus process latitude and an associated method for making such a mask.

BACKGROUND OF THE INVENTION

In lithographic printing systems, resolution is an important performance criteria. Resolution generally describes the ability of an optical system to distinguish between closely spaced objects. The resolution parameter of an optical system in lithography systems is important because it is one of the primary limitations in minimizing transistor device sizes. Presently, the quality of imaging systems is quite high so that the imaging characteristics are primarily limited by diffraction effects and therefore are often called "diffraction limited systems."

The manner in which the diffraction phenomena impacts lithography systems is illustrated in prior art FIG. 1a. Prior art FIG. 1a illustrates an illumination intensity distribution produced at a surface or substrate by a spatially coherent light source as it passes an edge such as a pattern on a reticle or mask. Ideally, as illustrated in prior art FIG. 1b, the illumination intensity profile at the substrate, where a pattern is to be transferred would appear as a step function, wherein a region beneath the reticle pattern or feature (e.g., an intended non-illumination region) would not be illuminated (e.g., a transmission=0), while the region not masked by the reticle feature would be fully illuminated (e.g., transmission=1). Diffraction effects, however, as illustrated in prior art FIG. 1a, cause the light radiation to spread into a region intended to be masked while a region near the reticle pattern edge which is to be fully illuminated experiences an attenuated illumination intensity. Furthermore, the intensity distribution in the illuminated region may be a series of alternating light and dark bands, and is dependent on the distance between the reticle and the substrate being exposed as well as the geometry of the slit (e.g., the region or space between neighboring features on the mask or reticle) through with the radiation travels.

Prior art FIGS. 2a–2c illustrate Fraunhofer diffraction which is experienced in most projection printing lithography systems where the distance between the reticle or mask and the substrate is substantial (as opposed to contact or proximity type printing systems). In FIG. 2a, plane waves of radiation encounter a slit having a width "w" and exhibit diffraction, resulting in an illumination intensity profile at a substrate or surface that is a function of the slit width "w" and the radiation wavelength λ. As can be seen in prior art FIGS. 2b and 2c, as the patterns on a mask or reticle get smaller to achieve smaller features on the substrate, the slit width "w" between features on the mask or reticle decreases which causes increased diffraction and decreased resolution at the substrate or surface.

One prior art solution to improving the resolution of a lithographic printing system involves mask design and is illustrated in prior art FIGS. 3a and 3b. Prior art FIG. 3a illustrates a fragmentary cross section of a traditional mask 10 having a transmissive substrate 12 such as glass and opaque features 14 thereon such as chrome. Radiation (e.g., ultraviolet (UV) light) passes through the transparent apertures 16 between the features 14 to expose, for example, a wafer substrate therebeneath (not shown) to thus transfer the mask or reticle pattern to the wafer substrate. At the mask 10, the electric field ($E_{mask}$) corresponding to the illumination intensity pattern has the same phase at each of the apertures 16.

Diffraction and the imperfect resolution of the optical system, however, causes the electric field pattern to spread into the intended non-illuminated regions 18 at the wafer substrate ($E_{substrate}$). Constructive interference of the electric field patterns at each aperture 16 enhances the electric field pattern underneath the features 14 at the wafer substrate. Since the illumination intensity pattern at the wafer substrate ($I_{substrate}$) is proportional to the square of the electric field ($E_{substrate}$), the illumination contrast at the wafer substrate between intended illuminated regions 19 and non-illuminated regions 18 is poor.

Prior art FIG. 3b illustrates a fragmentary cross section of a phase shift mask 20 having the substrate 12 and the opaque features 14 thereon. The apertures of the phase shift mask 20, however, differ from the apertures 16 of prior art FIG. 3a. In prior art FIG. 3b, a first aperture 22 is a traditional aperture while a second, neighboring aperture 24 has a portion 26 of the substrate 12 removed. If the depth of the aperture 24 is selected to be one-half of the radiation wavelength (λ/2), the phase of the electric field at the mask 20 ($E_{mask}$) will be 180° out of phase with the first aperture 22, as illustrated in prior art FIG. 3b.

Although the illumination intensity at the mask surface is identical to the traditional mask 10, destructive interference caused by the diffraction at the features 14 serves to minimize the electric field at the wafer substrate ($E_{substrate}$) in the desired non-illumination regions 18. Again, since the illumination intensity at the wafer substrate ($I_{substrate}$) is proportional to the square of the electric field ($E_{substrate}$),in this case the illumination intensity contrast between the intended illuminated regions 19 and non-illuminated regions 18 at the wafer substrate is substantially improved.

Although the phase shift mask 20 of prior art FIG. 3b exhibits substantially better performance than the traditional mask 10 of prior art FIG. 3a, diffraction effects still cause the non-illuminated regions 18 to be partially exposed. As features continue to decrease, however, the percentage of the intended non-illuminated region 18 which receives illumination continues to increase until eventually the entire region is illuminated and feature resolution is lost. Thus, although the phase shift mask 20 provides an improvement over the traditional mask 10, it too encounters difficulties in maintaining sufficient resolution as feature sizes continue to shrink.

In addition to difficulties in resolution as feature sizes continue to shrink, the phase shift mask 20 of FIG. 3b also suffers from limited focus process latitude. As discussed above, the phase shift mask 20 provides optimal destructive interference at a particular focal plane below the mask 20. Therefore it is desirable to locate the wafer substrate so that it coincides with that focal plane. If the surface of the wafer substrate deviates from the focal plane, the optimal destructive interference is not achieved and the system resolution is substantially degraded. The focus process latitude parameter is therefore an indication of how much variation from the optimal focal plane is permitted before sufficient resolution is lost.

Several factors may cause a wafer to be located off of the optimal focal plane, as illustrated in prior art FIG. 4. A mask 30 is preferably located a distance "d" away from a wafer 32 which is covered with a photosensitive film 34 such as a photoresist. The distance "d" represents the optimal focal plane at which optimal destructive interference exists in the intended non-illuminated regions 18 at the photoresist 34. The distance "d", although optimal, is typically not achieved, but rather varies by ±Δd so that the actual distance between the mask 30 and the film 34 is d±Δd. The variation ±Δd may be due to variations in the wafer thickness ±Δt$_1$ from wafer to wafer as well as variations within a wafer due to non-planarity, etc. In addition, the variation ±Δd may be due to variations in the resist thickness ±Δt$_2$ which can vary ±300 nm or more. Thus in order to maintain good system resolution, it is desirable to have a mask design which provides increased focus process latitude throughout the entire range of distances d±Δd that may be experienced during typical processing.

SUMMARY OF THE INVENTION

The present invention relates to a mask design and a method of fabrication having a mask pattern which includes a grating structure within the pattern which provides improved system resolution and focus process latitude.

According to one aspect of the present invention, a mask or reticle includes a pattern for transfer to a substrate. The pattern includes therein a grating having alternating opaque and transparent regions. The grating provides additional destructive interference in intended non-illumination areas at an optimal focal plane, thereby decreasing the illumination caused by diffraction in the intended non-illumination regions on the wafer substrate, which results in improved resolution. In addition, the grating increases the number of focal planes at which the advantageous destructive interference is achieved, thus substantially improving the focus process latitude of imaging systems using the mask.

According to another aspect of the present invention, the grating of alternating opaque and transparent regions have phase shift zones therein. According to a preferred embodiment of the present invention, the transparent regions in the grating are etched to a predetermined depth which is related to the wavelength of the radiation used in the system. The transparent regions transmit radiation therethrough at a phase which differs from the radiation passing through the mask in regions outside the grating. The phase difference of the various radiation components provides increased destructive interference in the intended non-illumination regions on the wafer substrate and thus further improves the system resolution and the focus process latitude. In addition, the feature sizes of the components within the grating and the predetermined depth of the transparent regions may be modified to vary or optimize the resolution and focus process latitude.

According to still another aspect of the present invention, a method of fabricating a mask having a pattern including a grating therein is disclosed. The method includes patterning a mask blank to form a desired pattern thereon. The resulting pattern is then again patterned to form a grating therein. The formation of the grating may be accomplished by use of a direct writing tool such as a scanning probe microscope or an electron beam apparatus. Alternatively, the grating may be formed using lithography techniques such as interferometric lithography. Once the grating is formed, the transparent regions in the grating may be etched to form phase shift regions which provide for improved resolution and focus process latitude when utilizing the mask, for example, in a lithographic printing process.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 is a flow chart illustrating a method of making a mask having a pattern which includes a grating therein according to the present invention;

FIG. 9 is a flow chart illustrating in greater detail a method of making a mask having a pattern which includes a grating according to the present invention;

FIGS. 10a–10d are fragmentary cross section diagrams illustrating steps of forming the mask of FIGS. 5 and 6;

DETAILED DESCRIPTION OF THE INVENTION

Figure 1A:
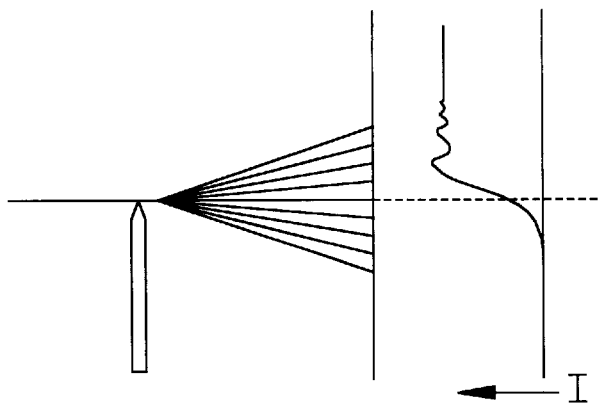
FIG. 1a is a prior art diagram illustrating diffraction effects upon an illumination intensity profile at a surface.
Figure 1B:
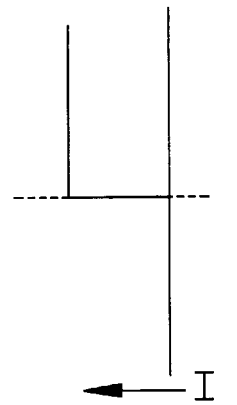
FIG. 1b is a prior art diagram illustrating an ideal illumination intensity profile at a surface without diffraction effects.
Figure 2A:
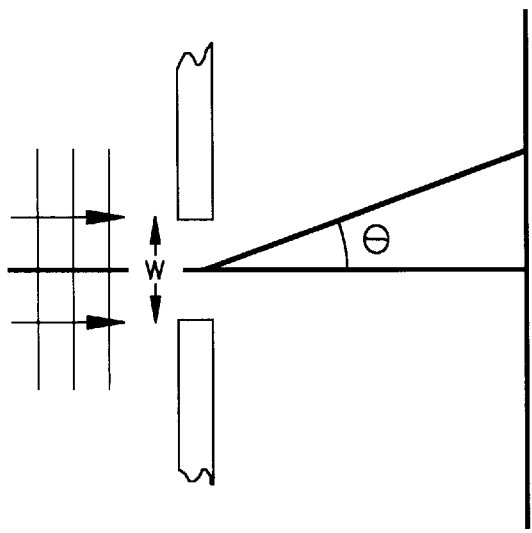
FIG. 2a is a prior art diagram illustrating diffraction effects upon an illumination intensity profile at a surface as a function of a slit width.
Figure 2B:
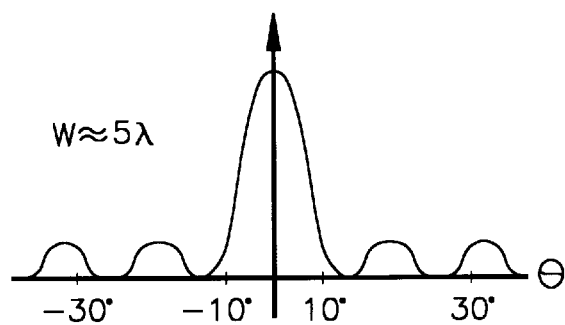
FIG. 2b is a graph illustrating an illumination intensity profile at a surface for a slit width which is five times as large as the radiation wavelength.
Figure 2C:
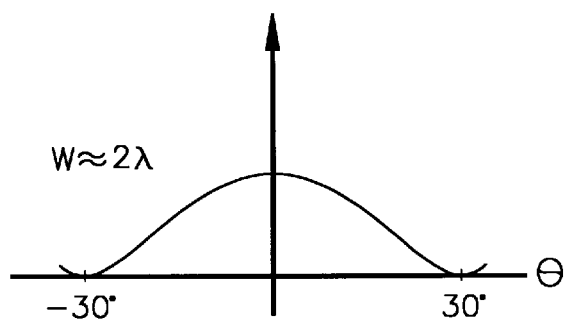
FIG. 2c is a graph illustrating an illumination intensity profile at a surface for a slit width which is three times as large as the radiation wavelength.
Figure 3A:
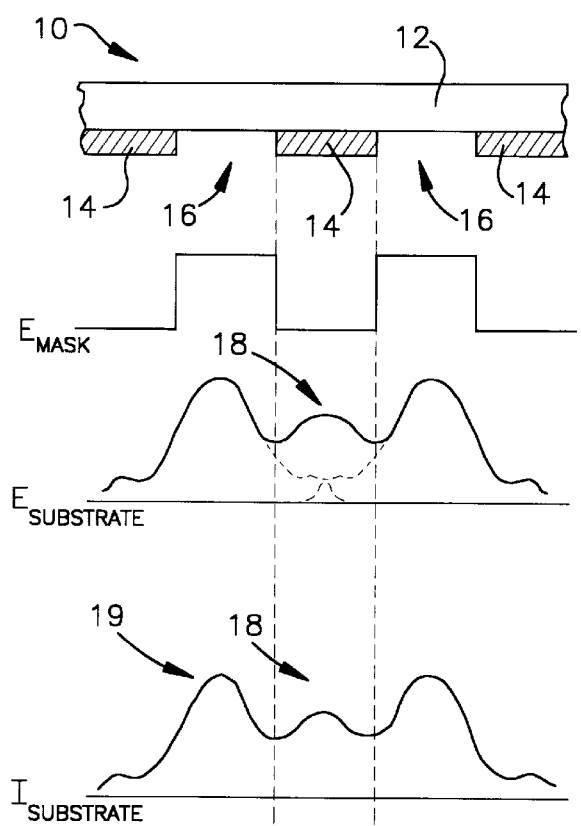
FIG. 3a is a prior art diagram illustrating the impact of diffraction upon the illumination intensity profile at a wafer substrate for a conventional mask design as the feature size on the mask decreases.
Figure 3B:
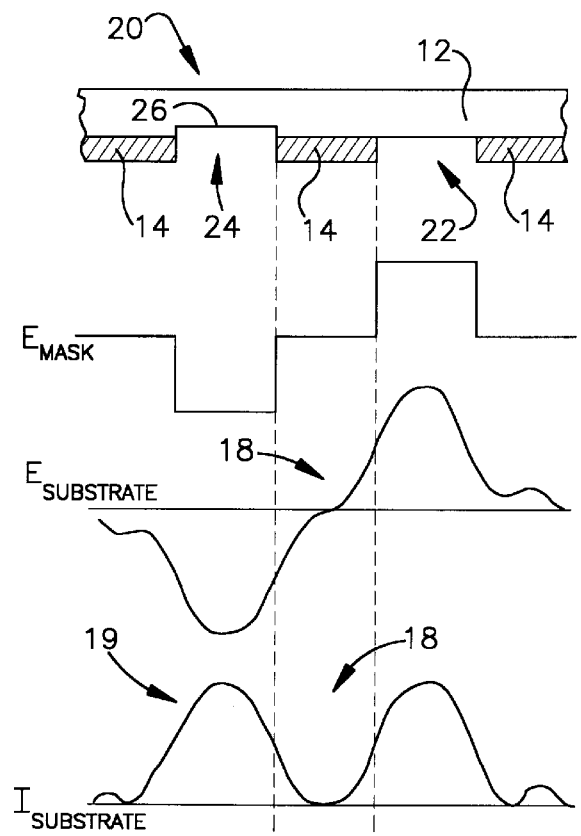
FIG. 3b is a prior art diagram illustrating the impact of diffraction upon the illumination intensity profile at a wafer substrate for a phase shift mask as the feature size on the mask decreases.
Figure 4:
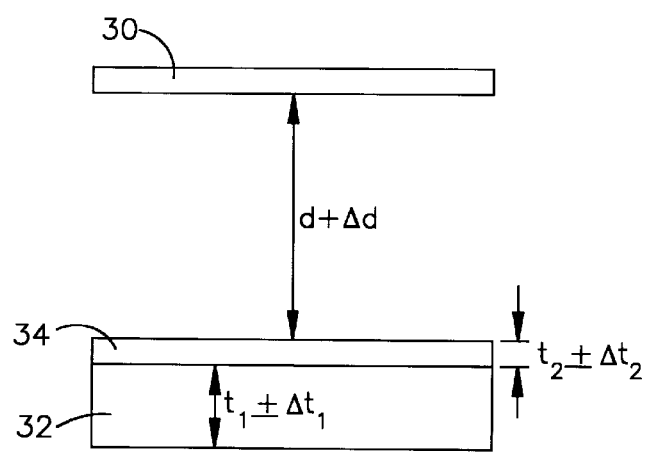
FIG. 4 is a prior art cross section view of a mask and a wafer substrate illustrating components which contribute to variations in the distance between the mask and the wafer substrate and which define a focus process latitude of an optical system.

The following is a detailed description of the present invention made in conjunction with the attached Figures, wherein like reference numerals will refer to like elements throughout. The present invention includes a new mask design having a pattern thereon. The pattern incorporates a grating-like structure within the pattern and includes an alternating pattern of opaque and transparent regions. Instead of attempting to completely block the radiation from passing through the pattern as provided in conventional mask designs, some radiation is permitted to pass through the transparent regions within the grating. The radiation which passes through the grating destructively interferes with radiation which passes through the mask in regions outside the mask grating which exists in intended non-illumination regions due to diffraction. The destructive interference reduces the illumination in the intended non-illumination areas on, for example, a wafer substrate, which improves the resolution of the optical system employing the mask. The grating also increases the number of optical focal planes at which a desirable destructive interference phenomena is experienced which allows for improved resolution over a substantial variation in distance between the mask and the wafer substrate. Consequently, the mask design of the present invention increases the focus process latitude of the system utilizing the mask.

In addition, the transparent regions in the grating-like pattern may be etched into the supporting substrate (such as glass) to a predetermined depth to form phase shift zones within the grating. The phase shift zones transmit radiation therethrough, but at a phase which differs from the radiation that passes through the mask outside of the phase shift zones. The phase difference between the various radiation components results in additional destructive interference in the intended non-illumination regions on the substrate, thus further reducing the illumination in the non-illumination regions which improves the resolution of the optical system employing the mask. Furthermore, the spacing of the alternating opaque and transparent regions within the grating as well as the etch depth in the transparent regions may be varied to optimize the resolution and the focus process latitude.

The present invention also relates to a method of manufacturing a mask. The present invention includes patterning a mask blank (including, for example, a transparent substrate such as glass and an opaque layer formed thereon such as chrome) to form a desired pattern thereon. The pattern represents the macroscopic pattern or feature which is desired to be transferred to the wafer or substrate. Once the macroscopic pattern is formed, a grating-like structure is patterned within the formed macroscopic pattern. Formation of the grating structure may be accomplished by a direct writing tool or alternatively via lithographic techniques such as with interferometric lithography to form an alternating pattern of opaque and transparent regions.

The method of the present invention may further include the formation of phase shift zones within the grating by, for example, an etching of the transparent regions within the grating to a predetermined depth. The etched transparent regions form phase shift zones which enhance the resolution of the system employing the mask. The etching of the transparent regions includes the formation and patterning of a protective layer in transparent areas of the mask outside of the grating. An etch is then performed for a selected period of time to obtain the predetermined depth which is preferably a function of the radiation wavelength being utilized in conjunction with the mask in order to achieve a preselected phase shift.

Figures 5A, 5B:
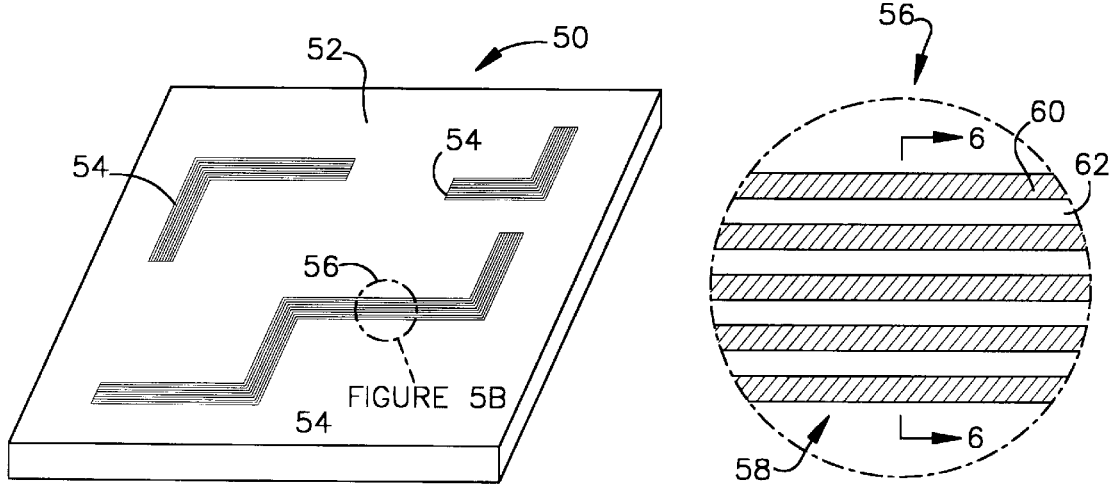
FIG. 5 is a perspective view of a mask having a plurality of patterns, wherein at least a portion of one of the patterns includes a grating formed therein according to the present invention.

Turning now to the Figures, FIG. 5 is a perspective view of a lithography mask 50 according to the present invention. Although the term "mask" will be used throughout, the term "mask" as used herein should be construed to include both traditional masks and reticles as those terms are understood by those of ordinary skill in the art. The mask 50 includes a transparent glass substrate 52 such as quartz; however, any type of mask substrate material which is transparent with respect to the radiation wavelength utilized in the system is contemplated as falling within the scope of the present invention. One or more patterns 54 are formed on the substrate 52 and comprise the macroscopic patterns which are intended to be transferred to an underlying substrate such as a semiconductor wafer (not shown). Note that the mask 50 typically has many more patterns 54 or features thereon with a substantially closer spacing, however, the patterns 54 of FIG. 5 are illustrated as shown for the sake of clarity and simplicity.

A selected portion 56 of one of the patterns 54 is also illustrated in an exploded view in FIG. 5. The portion 56 includes a grating-like structure 58 composed of a plurality of opaque regions 60 composed of an opaque material such as chrome and a plurality of transparent regions 62 which expose the underlying substrate 52. The plurality of opaque and transparent regions 60 and 62 are preferably arranged in an alternating pattern as illustrated. Although chrome is the preferred opaque material for the opaque regions 60 within the grating 58, other materials may also be used and are contemplated as falling within the scope of the present invention. In addition, it should be understood that some materials which are opaque with respect to one range of radiation wavelengths may be substantially transparent with respect to another radiation wavelength range. Therefore it should be understood that any material which is opaque with respect to the radiation wavelength being utilized in conjunction with the mask 50 is contemplated by the present invention (e.g., gold or titanium at X-ray wavelengths).

In addition, although the preferred embodiment of the present invention utilizes alternating opaque and transparent regions 60 and 62, the regions 60 and 62 may alternatively comprise alternating semi-opaque and semi-transparent regions. Typically, a semi-opaque material exhibits a radiation transmittance of about 0% to about 15%, however, new mask materials are being developed which provide a radiation transmittance of about 20% or more and such materials are contemplated as falling within the scope of the present invention. In addition, a typical semi-transparent material exhibits a radiation transmittance of about 90% to about 100%, however, new materials are being developed which provide radiation transmittance levels of 85% or less. Therefore any range of radiation transmittance between 0% and 100% is contemplated as falling within the scope of the present invention.

Figure 6:
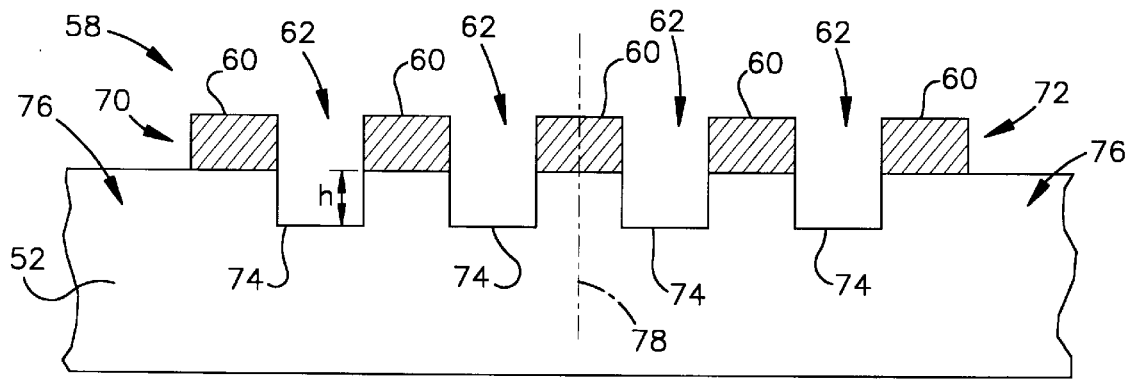
FIG. 6 is a cross section view taken along dotted line 6—6 of FIG. 5 illustrating an exemplary grating structure for a mask pattern according to the present invention.

A cross section view taken along the dotted line 6—6 of FIG. 5 is illustrated in FIG. 6. The grating 58 has a first end 70 and a second end 72 defined by the outside opaque regions 60. The first and second ends 70 and 72 define the width of the macroscopic pattern at the portion 56 which is to be transferred to the underlying substrate. According to a preferred embodiment of the present invention, the transparent regions 62 include trenches 74 which are formed within the substrate 52. The trenches 74 are preferably each formed within the substrate 52 and have a predetermined depth "h" which is a function of the radiation wavelength ($\lambda$) utilized in the present invention; thus h=f($\lambda$). Although the preferred embodiment of the present invention utilizes ultraviolet (UV) radiation (e.g., *183* nm, *193* nm, *248* nm, *365* nm, etc.), the present invention is equally applicable to other radiation wavelengths (e.g., extreme ultraviolet wavelengths (EUV) or X-rays) and such variations in wavelength are contemplated as falling within the scope of the present invention.

The height "h" of the trenches 74 dictates the amount of phase shift provided by the transparent regions 62. Preferably, the height "h" (which may alternatively be referred to as the depth) of the trenches is $\lambda/2$ (e.g. 124 nm for a radiation wavelength of 248 nm) so that the radiation which passes through the transparent regions 62 is 180° out of phase with the radiation which passes through the mask 50 in regions 76 outside of the grating 58. Thus the transparent regions 62 within the grating 58 may be considered phase shift zones.

Figure 7A:
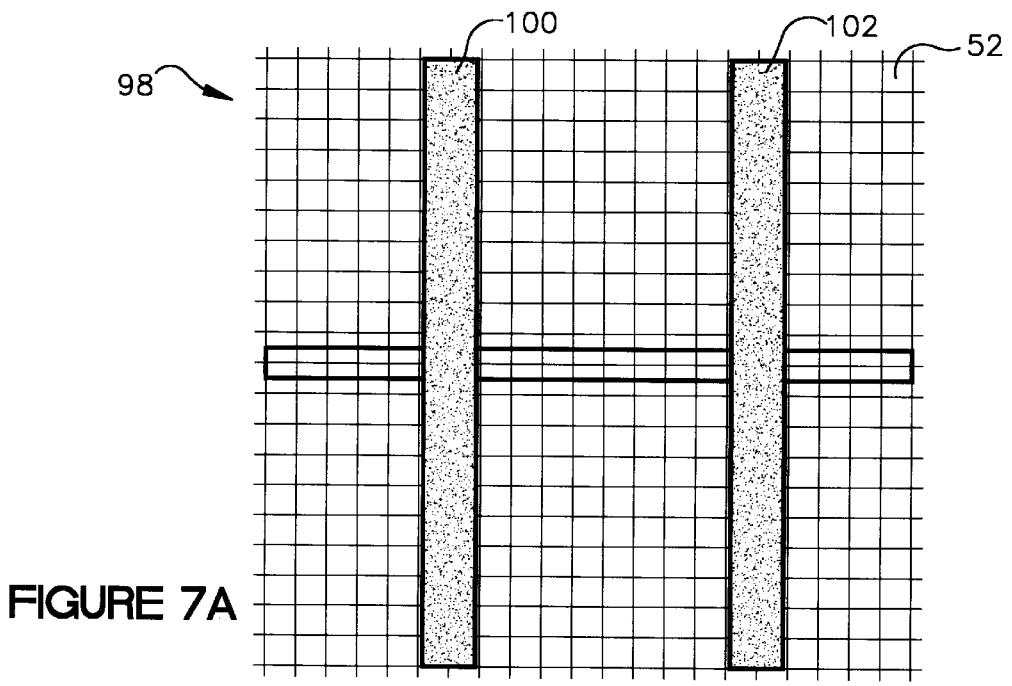
FIGS. 7a–7j are diagrams and graphs illustrating the grating structure of the present invention and how the grating improves the resolution and the focus process latitude at the wafer substrate over the prior art.

The manner in which the grating 58 provides improved resolution and focus process latitude over prior art mask designs is illustrated in FIGS. 7a–7j. FIG. 7a is a fragmentary top view of a mask 98 including a mask substrate 52 having a conventional binary type mask pattern 100 and a grated phase shift mask pattern 102 formed thereon according to the present invention. Each feature 100 and 102 is approximately 0.18 um wide and the grated phase shift mask pattern 102 has five (5) trenches 74, wherein each trench is about 124 nm deep to provide a phase shift of about 180° at a radiation wavelength of 248 nm. In addition, each trench 74 in the grated phase shift mask pattern 102 is about 20 nm wide at 1× (which is the equivalent of 80 nm at 4×). The mask 98 containing the differing patterns 100 and 102 was simulated using SOLID-C lithography simulation software manufactured by SIGMA-C of Germany and the illumination intensity profiles at various mask/wafer distances were analyzed to compare the focus process latitude performance of the patterns 100 and 102.

Figure 7B:
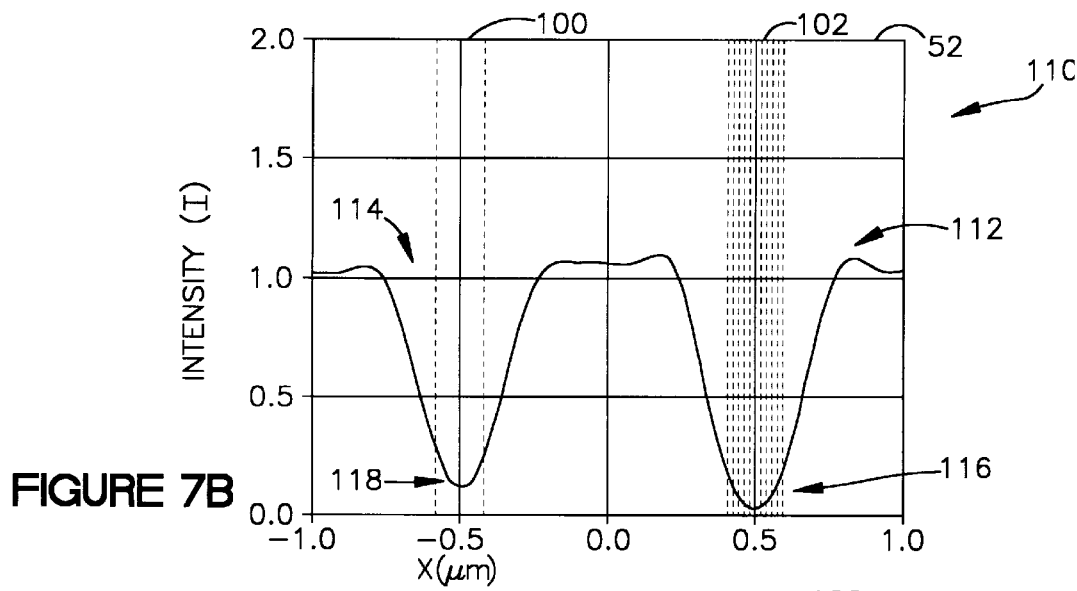

A comparative, normalized illumination intensity profile at a wafer or substrate located in the optimal focal plane (i.e., zero focus) is illustrated in the graph 110 of FIG. 7b. As can be seen, the intensity profile 112 of the grated phase shift mask pattern 102 is substantially better than the intensity profile 114 of the convention binary mask structure 100. Note in FIG. 7b that the intensity at a center point 116 of the intensity profile 112 is substantially less than the intensity at a center point 118 of the conventional mask profile 114. This indicates that less illumination occurs in the non-intended illumination areas using the grated phase shift mask pattern 102. In addition, note that the slopes of the intensity profile 112 are steeper than the slopes of the conventional profile 114. Thus as resist variations occur, the variations in the critical dimension of a patterned feature is substantially decreased, thereby advantageously increasing the critical dimension control.

The above phenomena may be seen and appreciated in the following example, as illustrated in FIG. 7b. If a first resist requires a normalized illumination intensity of 0.5 in order to be developed subsequently, the critical dimension of the feature resulting from the binary pattern 100 and the grated phase shift mask pattern 102 may be determined by laterally scrolling across the point I=0.5 on the graph 110. If, then, a second resist is used which varies from the first resist and instead requires a normalized illumination intensity of I=0.75 to be developed, the resulting patterns using the mask patterns 100 and 102 would differ, however, the critical dimension change of the profile 114 is substantially smaller than the slope of the profile 114. Thus the grated phase shift mask pattern 102 provides better performance than a conventional binary mask pattern 100 by exhibiting better critical dimension control (i.e., is less sensitive to resist variations). In addition, the grated phase shift mask pattern 102 shields more radiation from the intended non-illumination regions than the prior art.

Figure 7C:
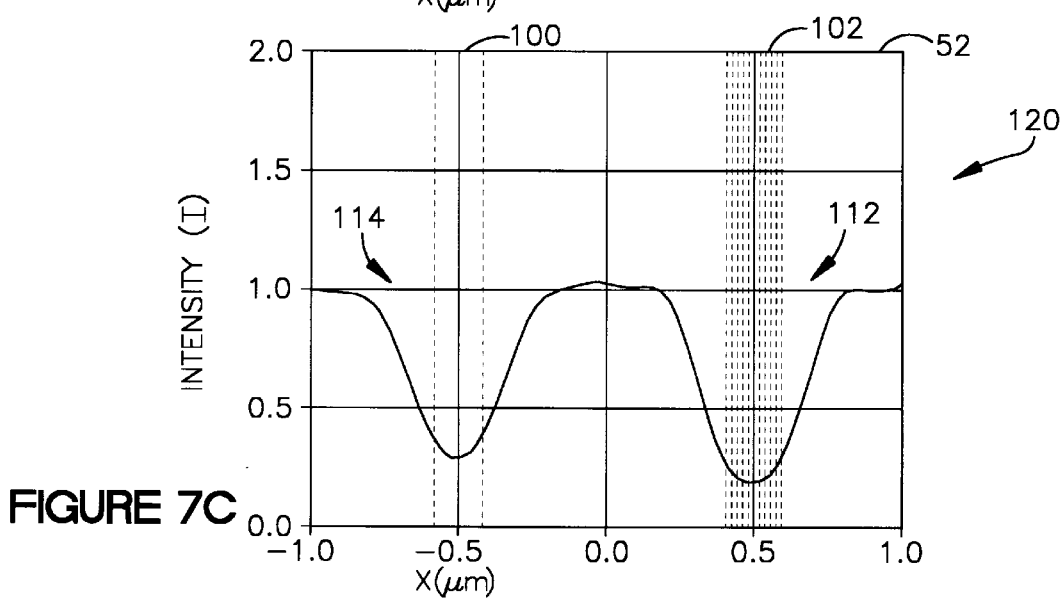
Figure 7D:
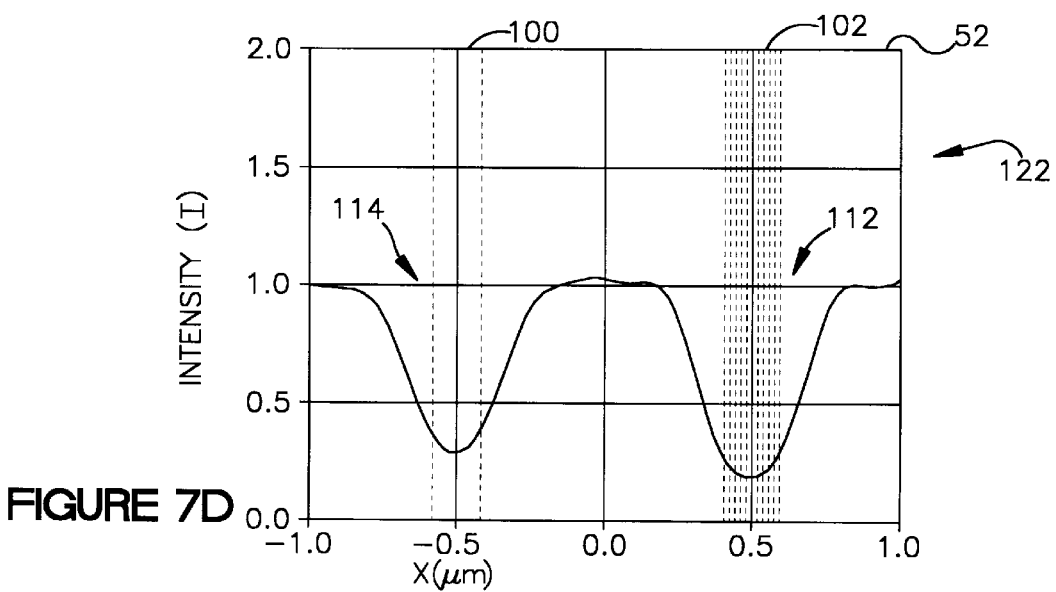

FIGS. 7c and 7d illustrate graphs 120 and 122, respectively, showing the normalized illumination intensity patterns 1 12 and 114 of the mask patterns 100 and 102 at positive focus and negative focus, respectively. FIG. 7c illustrates a positive focus, wherein the distance between the mask substrate 52 and the wafer substrate is decreased from the optimal focal plane. Likewise, FIG. 7d illustrates a negative focus, wherein the distance between the mask substrate 52 and the wafer substrate is increased from the optimal focal plane. As illustrated in both graphs 120 and 122, the grated phase shift mask pattern 100 at both positive and negative focus. Consequently, the grated phase shift mask pattern 102 of the present invention provides a substantial improvement in focus process latitude over the prior art.

Figure 7E:
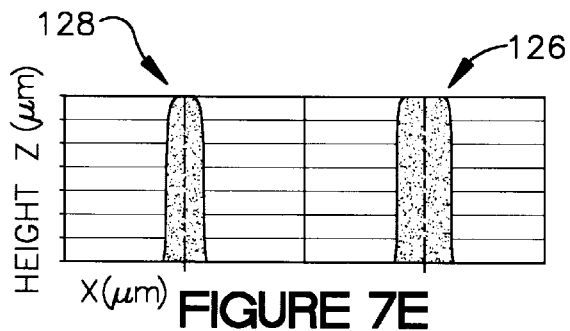
Figure 7H:
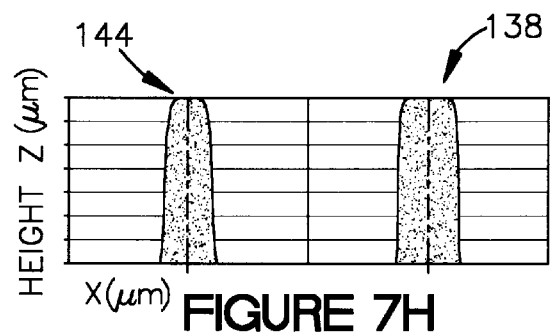
Figure 7F:
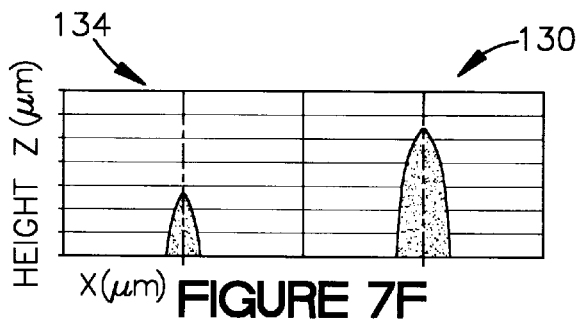
Figure 7I:
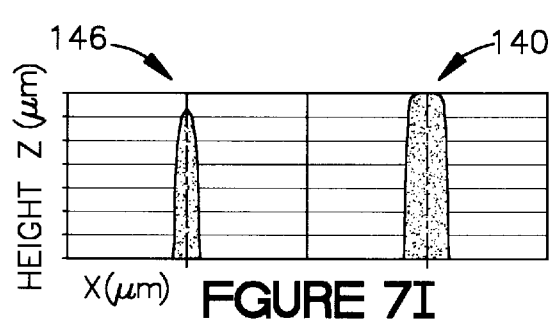
Figure 7G:
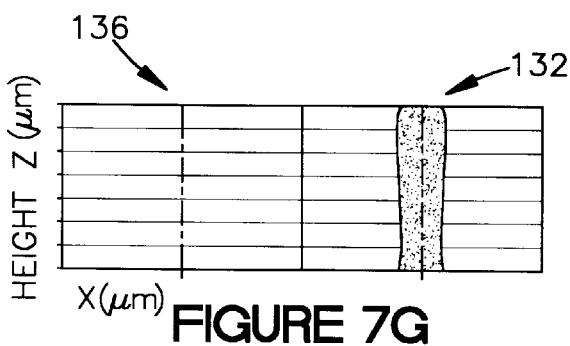

FIGS. 7e–7g are graphs which illustrate simulated positive resist profiles generated form the illumination intensity profiles of FIGS. 7b–7d, respectively. As illustrated in FIG. 7e, a resist profile 126 produced by the illumination intensity profile 112 of FIG. 7b (i.e., produced from the grated phase shift mask pattern 102 at zero focus) is substantially better than a resist profile 128 produced by the conventional binary mask pattern 100 because the desired feature size is more faithfully reproduced. Furthermore, as seen in FIGS. 7f and 7g, as the focus is changed from positive focus to negative focus, the resist profiles 130 and 132 of the present invention are more consistent than the resist profiles 134 and 136 of the prior art. In fact, as can be clearly seen from FIGS. 7f and 7g, the improvement in focus process latitude of the grated phase shift mask pattern 102 over the prior art binary mask pattern 100 is substantial since critical dimension control at negative focus is lost in profile 136 entirely.

Figure 7J:
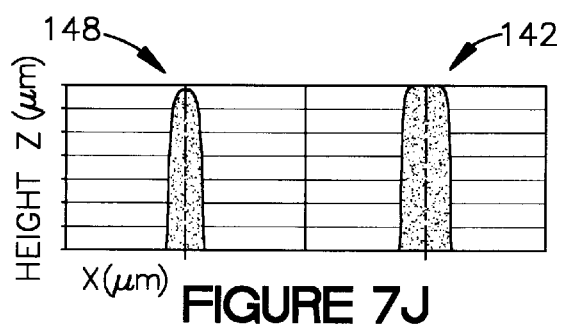
Figure 11:
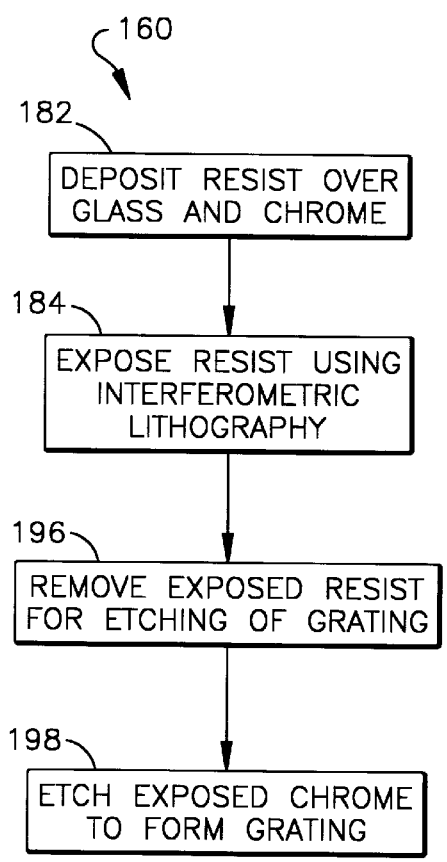
FIG. 11 is a flow chart illustrating a method of forming the grating within the pattern according to the present invention.

In addition to the above improvements, the grated phase shift mask pattern 102 also provides for improved critical dimension control as other parameters such as illumination intensity vary, as illustrated in FIGS. 7h–7j. In FIG. 7h, the radiation intensity dose is about 15 mJ/cm$^2$, while FIG. 7i and 7j illustrate resist profiles generated by radiation doses of 12 mJ/cm$^2$ and 9 mJ/cm$^2$, respectively. As can be seen in FIGS. 7h–7j, the resist profiles 138, 140 and 142 generated by the grated phase shift mask pattern 102 is substantially more consistent than the resist profiles 144, 146 and 148 generated by the conventional binary mask pattern 100, respectively. Therefore according to the present invention, the grated phase shift mask pattern 102 provides better critical dimension control, improved resolution and increased focus process latitude over the prior art.

According to a preferred embodiment of the present invention, the grating 58 is symmetric about a center axis 78 as shown in FIG. 6 in order for the destructive interference which occurs at the wafer substrate to be symmetric on each side 70 and 72 of the pattern portion 56. Alternatively, however, the grating 58 may be varied and be non-symmetric to account for unique processing considerations or performance requirements as may be desired. In addition, the alternating pattern of opaque and transparent regions 60 and 62 are preferably of equal width, however, the relative widths of the regions 60 and 62 may be varied as desired to account for unique processing considerations or to optimize the mask design as may be desired. Lastly, it is preferred that each of the opaque regions 60 have the same width and that each of the transparent regions 62 have the same width, respectively. Alternatively, however, the widths of the regions 60 and 62 may each be varied to optimize the mask resolution or focus process latitude. For example, variations in the grating 58 as described above may be effectuated to maximize resolution at the expense of focus process latitude or vice versa. Alternatively, the grating 58 dimensions may be varied to balance the resolution and focus process latitude performance. In any case, the present invention appreciates such variations and such alternatives are contemplated as falling within the scope of the present invention.

As can be seen above in conjunction with FIG. 7, it is preferable that the grating include a plurality of phase shift zones (e.g., via the etched transparent regions 62). Alternatively, however, the grating 58 may consist solely of the alternating pattern of opaque and transparent regions 60 and 62 without any phase shift zones. In such a case, the depth of the trenches 74 is zero. Although such a mask 50 does not provide the same level of resolution performance as the preferred embodiment, the resolution of the mask having a grating 58 without phase shift zones is still better than the prior art and the focus process latitude improvement is substantial.

According to another alternative embodiment of the present invention, the phase shift zones of the preferred embodiment may be achieved by depositing a transparent phase shift layer over the grating 58. The phase shift layer preferably has a thickness which is a function of the radiation wavelength being utilized. In such a case, the radiation passing through the phase shift layer overlying the grating 58 has a phase which is different than the radiation in the regions 76 outside the grating 58, thus resulting in optimized destructive interference in the intended non-illumination regions on the wafer substrate. Because the phase shift layer may have an index of refraction that differs from the underlying substrate 52 (such as quartz), the thickness "t" of the phase shift layer may be, for example, $t=(\lambda/2)(n-1)$, wherein "n" is the index of refraction of the transparent phase shift layer. The phase shift layer may be one of many different materials such as polymethyl methacrylate (PMMA) resist or terpolymer.

According to still another embodiment of the present invention, the phase shift zones may be effectuated by the opaque regions 60 as opposed to the transparent regions 62. In such a case, the material selected as the opaque material is partially transparent. For example, for an X-ray mask, gold or titanium are often used to define the macroscopic patterns. Since gold is partially transparent to X-ray radiation, the portion of radiation which is transmitted through the gold is phase shifted with respect to the radiation passing through the transparent regions 62 as well as the regions 76 outside of the macroscopic pattern. Consequently, the present invention contemplates any form of grating structure which effectuates a destructive interference of radiation in the intended non-illumination regions at the wafer substrate.

Turning now to the flow chart of FIG. 8, a method 150 of making the mask 50 having a pattern 54 which includes the grating 58 is disclosed. The method 150 includes a patterning of a mask blank at step 152. An exemplary manner of accomplishing step 152 is illustrated in the flow chart of FIG. 9. Step 152 begins with the depositing and patterning of a photoresist material on the mask blank at step 154. Preferably, the mask blank includes a quartz mask substrate 52 and a layer of chrome 155 of about 1,000 Angstroms or less. A layer of photoresist 156 such as PMMA is then applied via, for example, spin coating. The resist 156 is preferably soft-baked rapidly and then exposed using either optical techniques or an electron beam (e-beam) to form the desired macroscopic pattern. Subsequently, the resist 156 is developed using, for example, a spray technique and the exposed areas are removed, as illustrated in FIG. 10a.

Once the resist 156 has been patterned at step 154, the exposed underlying chrome is etched using either a wet or dry etch technique at step 157. Some exemplary wet etchants include an alkaline etchant, ceric ammonium nitrate or ceric sulfate. Alternatively, dry etching (i.e., plasma etching) may be utilized to pattern the chrome 155. Exemplary etch chemistries include $CCl_4$, $Cl_2$, and $CF_4$, each within an oxygen ambient. Once the chrome 155 is etched, the overlying resist is removed via, for example, a rinse at step 158.

Returning now to FIG. 9, once the macroscopic pattern 54 is formed on the substrate 52 at step 152, the grating 58 is formed within the opaque pattern 54 such as chrome at step 160. The forming of the grating 58 may be accomplished using any one of a number of direct writing tools or techniques which are capable of writing extremely small features of about 20 nm at 1× (which is equivalent to 80 nm at 4×). For example, the grating 58 may be formed using an electron beam exposure system (EBES) or a scanning probe microscope which is used in atomic force microscopy (often called scanning probe lithography (SPL)) which patterns organic resists with electrons emitted from a micromachined tip which is in close proximity to the resist surface. Additional details of scanning probe lithography are discussed in "Lithography Process Control: Tolerance Limits of Deep Ultraviolet Photolithography, Electron Beam Lithography, and Scanning Probe Lithography", Wilder et al., Proceedings of EIPBN Conference (June 1998), which is hereby incorporated by reference in its entirety. In either case, the grating 58 is formed by removing portions of the chrome associated with the regions 62 which are intended to be transparent regions, as illustrated in FIG. 10b. Although the present invention discloses the formation of the grating in conjunction with an e-beam apparatus or a scanning probe microscope, any direct writing tool capable of forming the grating is contemplated as falling within the scope of the present invention.

As illustrated in FIG. 9, additional mask processing steps may be performed to form phase shift zones within the grating 58. At step 162, a protective layer 164 such as a photoresist is deposited and then patterned over the mask surface to serve as a protective barrier for the regions 76 that are outside of the grating 58, as illustrated in FIG. 10c. An etch step is then performed at step 166 which is substantially selective with respect to the substrate material 52 (e.g., quartz) in order to etch the quartz down a predetermined depth (e.g., a depth $\lambda/2$) without substantially impacting the grating 58, as illustrated in FIG. 10d. Preferably, a wet etch chemistry such as fluorine is utilized, however, any type of etchant, either wet or dry, which is capable of performing the high precision etch is contemplated as falling within the scope of the present invention. Subsequently, the protective layer 164 is removed at step 168.

Figure 12A:
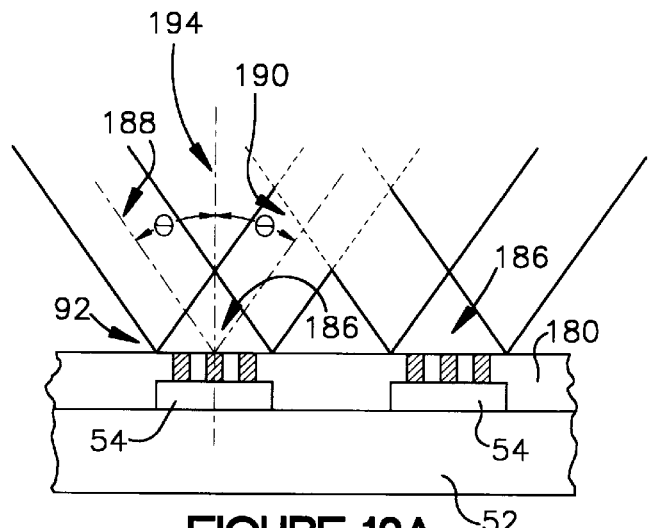
FIGS. 12a–12d are fragmentary cross section diagrams illustrating steps of forming the grating of FIGS. 5, 6 and 11.

According to another alternative embodiment of the present invention, the grating 58 may be formed via lithographic techniques such an interferometric lithography, as illustrated in FIGS. 11 and 12a–12d. Initially, a resist 180 is formed over the macroscopic patterns 54 and the glass substrate 52 at step 182. Subsequently, the resist 180 is exposed using an interferometric lithography technique at step 184, as illustrated in FIG. 12a to form an exposed grating pattern 186 in the resist 180.

According to an exemplary embodiment, two interfering beams 188 and 190 of coherent radiation are focused at regions 192 of the resist 180 corresponding to a desired location for a grating therebeneath. The two beams 188 and 190 are incident on the resist 180 at angles $\theta$ and $-\theta$ to a surface normal 194 and thus are symmetric thereto. For the two beams 188 and 190 incident on the resist 180 at an angle $\theta$, the period of the interference pattern 186 created in the region 192 is $\lambda/(2\sin\theta)$. For example, with a radiation of 361 nm and a $\theta=75°$, an interference period of about 187 nm is achieved.

Figure 12B:
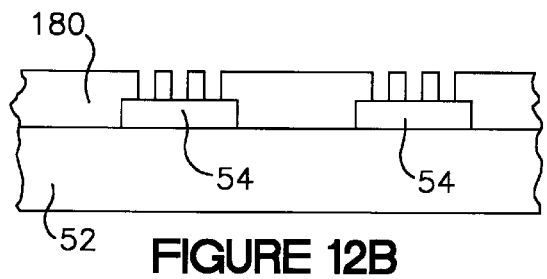
Figure 12C:
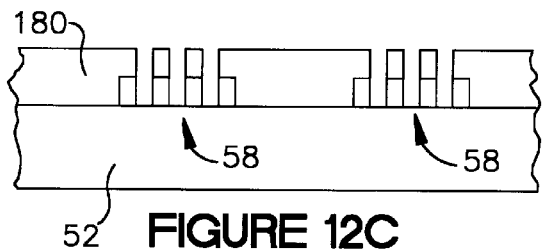
Figure 12D:
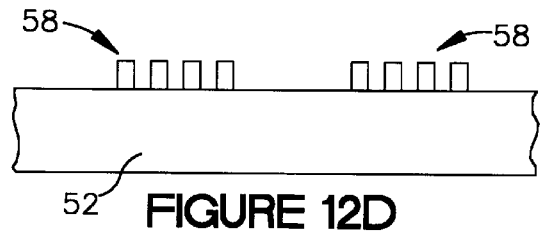

The exposed resist 180 is then developed via, for example, a spray technique and the grating portion 186 of the resist 180 is removed at step 196, as illustrated in FIG. 12b. The underlying exposed chrome patterns 54 are then etched, preferably with a wet etch such as a fluorine etchant, at step 198, to form the grating 58, as illustrated in FIG. 12c. Lastly, the photoresist 180 is removed, as illustrated in FIG. 12d. Additional processing may then be performed to fabricate phase shift zones as discussed above, if desired.

Although the invention has been shown and described with respect to a certain preferred embodiment or embodiments, it is obvious that equivalent alterations and modifications will occur to others skilled in the art upon the reading and understanding of this specification and the annexed drawings. In particular with regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of generating a mask exhibiting improving resolution and focus process latitude in a lithographic printing system, comprising the steps of:

patterning a mask blank to form a patterned mask; and patterning a grating in a portion of the patterned mask, wherein the grating includes a pattern of alternating opaque and transparent regions.

2. The method of claim 1, further comprising the step of utilizing the patterned mask in the lithographic printing system, wherein the grating provides a destructive interference of radiation passing therethrough at a substrate in a region corresponding to the portion due to diffraction, and wherein the grating increases a number of focal planes at which destructive interference occurs.

3. The method of claim 1, wherein patterning the mask blank comprises the steps of:

depositing a photoresist layer over an opaque layer of the mask blank;

patterning the photoresist layer into a pattern;

patterning the opaque layer to form a macroscopic pattern corresponding to a desired feature on the substrate; and removing the photoresist.

4. The method of claim 1, wherein patterning the grating comprises removing opaque portions of the patterned mask using a direct writing tool selected from the group including an atomic force microscope, a scanning probe microscope or an electron beam device.

5. The method of claim 1, wherein patterning the grating comprises:

depositing a photoresist over the patterned mask;

exposing a region of the photoresist corresponding to the portion on the patterned mask with interfering light beams, wherein the light beams form an interference pattern on the photoresist corresponding to the grating;

removing exposed portions of the photoresist corresponding to the interference pattern;

patterning the patterned mask using the interference pattern in the photoresist, thereby forming the grating in the portion of the patterned mask; and removing the photoresist.

6. The method of claim 1, further comprising patterning the transparent regions of the grating down to a predetermined depth, wherein the predetermined depth is a function of a wavelength of radiation used by the lithographic printing system, thereby forming a plurality of phase shift regions.

7. The method of claim 6, wherein the predetermined depth is approximately one-half of the radiation wavelength, thereby resulting in a phase shift of about 180°.

8. The method of claim 6, wherein patterning the transparent regions comprises:

depositing a protective layer over the patterned mask;

patterning the protective layer to expose the grating;

etching the transparent regions with an etch chemistry which is substantially selective with respect to the transparent regions; and removing the protective layer.

9. The method of claim 8, wherein etching the transparent regions comprises wet etching for a predetermined period of time, wherein the predetermined period of time is a function of the predetermined depth.

10. A method of generating a mask exhibiting improving resolution and focus process latitude in a lithographic printing system, comprising the steps of:

patterning a mask blank to form a patterned mask containing one or more structures of substantially opaque material thereon which correspond to one or more macroscopic features which are intended to be transferred to a substrate in a lithographic printing process; and patterning a grating in a portion of the one of the structures on the patterned mask, wherein the grating includes a pattern of alternating opaque and transparent regions within the one of the structures, wherein when utilized within a lithographic printing process the grating provides a destructive interference of radiation passing therethrough at the substrate in a region corresponding to the one of the structures due to diffraction, thereby improving an optical resolution at the substrate, and wherein the grating increases a number of focal planes at which destructive interference occurs, thereby increasing a focus process latitude of the lithographic printing process.

* * * * *

UNITED STATES PATENT AND TRADEMARK OFFICE
CERTIFICATE OF CORRECTION

PATENT NO.: 6,013,396

DATED: January 11, 2000

INVENTOR(S): Luigi Capodieci

It is certified that error appears in the above-identified patent and that said Letters Patent is hereby corrected as shown below:

Column 8, line 3, please delete the numeral "1 12" and insert the numeral --112--.

Column 8, line 17, please delete the word "form" and insert --from--.

Column 10, line 53, please delete the word "an" and insert --as--.

Signed and Sealed this

Fifth Day of September, 2000

Q. TODD DICKINSON

Attest:

Attesting Officer

Director of Patents and Trademarks